(12) United States Patent
Ren et al.

(10) Patent No.: US 11,410,885 B2
(45) Date of Patent: Aug. 9, 2022

(54) FULLY ALIGNED SUBTRACTIVE PROCESSES AND ELECTRONIC DEVICES THEREFROM

(71) Applicant: Applied Materials, Inc., Santa Clara, CA (US)

(72) Inventors: He Ren, San Jose, CA (US); Hao Jiang, San Jose, CA (US); Mehul Naik, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/864,623

(22) Filed: May 1, 2020

(65) Prior Publication Data
US 2020/0350206 A1    Nov. 5, 2020

Related U.S. Application Data

(60) Provisional application No. 62/841,788, filed on May 1, 2019.

(51) Int. Cl.
*H01L 21/768*    (2006.01)
*H01L 21/3213*   (2006.01)
*H01L 23/522*    (2006.01)

(52) U.S. Cl.
CPC .. *H01L 21/76897* (2013.01); *H01L 21/32135* (2013.01); *H01L 21/32139* (2013.01); *H01L 21/7685* (2013.01); *H01L 21/76819* (2013.01); *H01L 21/76837* (2013.01); *H01L 21/76892* (2013.01); *H01L 23/5226* (2013.01)

(58) Field of Classification Search
CPC ........... H01L 21/76838; H01L 51/0023; H01L 21/768; H01L 21/76841; H01L 21/76885; H01L 21/76865; H01L 21/76892; H01L 21/76829; H01L 21/768632
See application file for complete search history.

(56) References Cited

U.S. PATENT DOCUMENTS

| | | | |
|---|---|---|---|
| 9,287,162 B2 | 3/2016 | Lao | |
| 9,362,165 B1 | 6/2016 | Bouche et al. | |
| 9,761,489 B2 | 9/2017 | Mebarki et al. | |
| 10,319,637 B2 | 6/2019 | Mohanty et al. | |
| 2008/0036089 A1* | 2/2008 | Ishida | H01L 21/76838 257/751 |

(Continued)

FOREIGN PATENT DOCUMENTS

| KR | 20140090946 A | 7/2014 |
|---|---|---|
| KR | 20180052106 A | 5/2018 |

OTHER PUBLICATIONS

PCT International Search Report and Written Opinion in PCT/US2020/031003 dated Aug. 14, 2020, 9 pages.

*Primary Examiner* — Thanhha S Pham
(74) *Attorney, Agent, or Firm* — Servilla Whitney LLC

(57) ABSTRACT

Methods of forming fully aligned vias connecting two metal lines extending in two directions are described. The fully aligned via is aligned with the first metal line and the second metal line along both directions. A third metal layer is patterned on a top of a second metal layer in electrical contact with a first metal layer. The patterned third metal layer is misaligned from the top of the second metal layer. The second metal layer is recessed to expose sides of the second metal layer and remove portions not aligned sides of the third metal layer.

10 Claims, 10 Drawing Sheets

(56) References Cited

U.S. PATENT DOCUMENTS

| | | | |
|---|---|---|---|
| 2012/0329275 A1* | 12/2012 | Ponoth | H01L 21/76885 438/666 |
| 2015/0221643 A1* | 8/2015 | Cheng | H01L 21/3065 257/384 |
| 2016/0293485 A1 | 10/2016 | Song et al. | |
| 2018/0308754 A1 | 10/2018 | Guler | |

\* cited by examiner

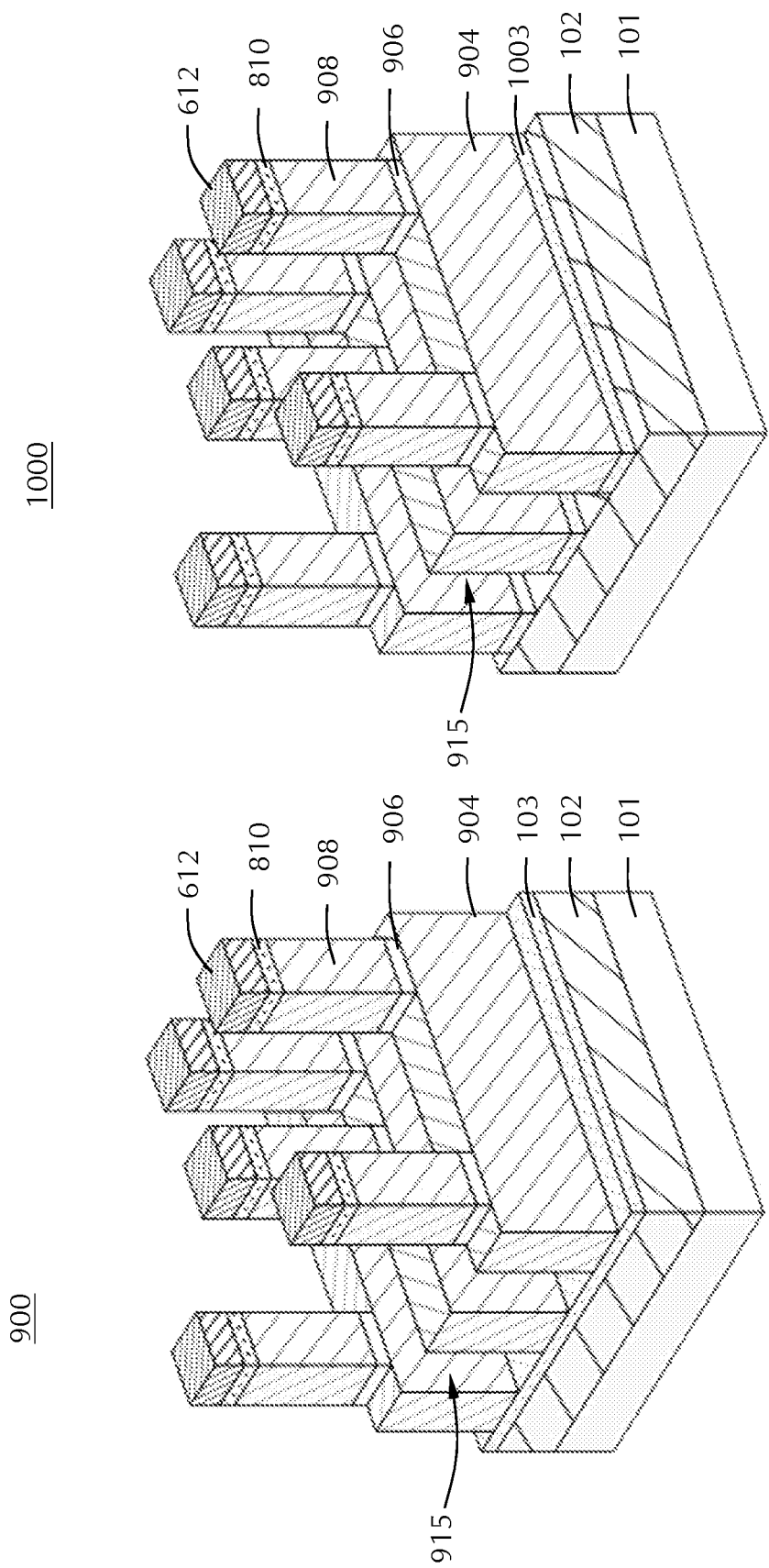

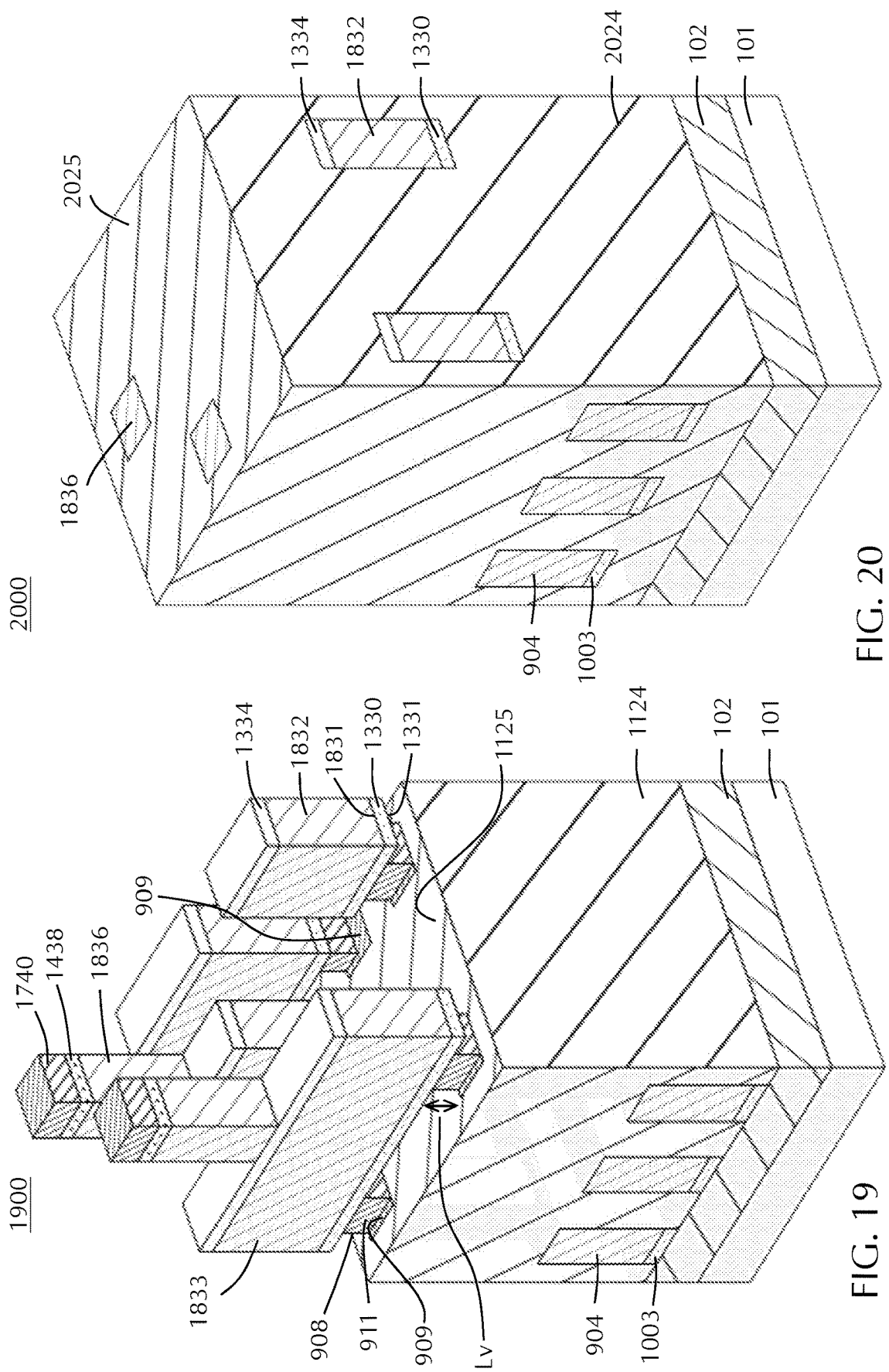

FULLY ALIGNED SUBTRACTIVE PROCESSES AND ELECTRONIC DEVICES THEREFROM

CROSS-REFERENCE TO RELATED APPLICATIONS

This application claims priority to U.S. Provisional Application No. 62/841,788, filed May 1, 2019, the entire disclosure of which is hereby incorporated by reference herein.

TECHNICAL FIELD

Embodiments of the present disclosure pertain to the field of electronic devices and electronic device manufacturing. More particularly, embodiments of the disclosure provide methods for creating electronic devices with fully aligned vias and/or contacts using a subtractive process.

BACKGROUND

Electronic devices, such as personal computers, workstations, computer servers, mainframes and other computer related equipment such as printers, scanners and hard disk drives use memory devices that provide substantial data storage capability, while incurring low power consumption. There are two major types of random-access memory cells, dynamic and static, which are well-suited for use in electronic devices. Dynamic random-access memories (DRAMs) can be programmed to store a voltage which represents one of two binary values, but require periodic reprogramming or "refreshing" to maintain this voltage for more than very short periods of time. Static random-access memories (SRAM) are so named because they do not require periodic refreshing.

On-chip electrical interconnections have previously been produced using "dual-damascene" fabrication techniques in which apertures are created through various layers of the device structure, and the apertures are filled with a conductive material to form the interconnects between layers and between device features located on individual layers. However, for chips which are based on 10 nm Node and smaller feature sizes, there are gap fill and resistivity constraints which make it impractical to use the "dual-damascene" fabrication techniques which have previously been relied upon.

Current processes frequently encounter via alignment issues during interconnect fabrication. At advanced technology nodes there is little or no margin for via alignment errors. Subtractive schemes have been developed to allow formation of vias (Vx) that are self-aligned with the underlying metal line (Mx). However, the top metal line (Mx+1) is not self-aligned which can allow for alignment errors.

Accordingly, there is a need for methods of forming electronic devices that reduce or eliminate via alignment errors.

SUMMARY

Embodiments of the disclosure are directed to methods of forming fully aligned vias. A third metal layer on a top of a second metal layer is patterned. The second metal layer is in electrical contact with a first metal layer. The patterned third metal layer is misaligned from the second metal layer so that a portion of the top of the second metal layer is exposed. The top of the second metal layer is recessed to expose sides of the second metal layer aligned with the patterned third metal layer. A top of the second metal layer is recessed a distance from the bottom of the third metal layer.

Additional embodiments of the disclosure are directed to methods of forming fully aligned vias. A patterned third metal layer is formed on top of a patterned metal liner on a second metal layer. The second metal layer is in electrical contact with a first metal layer. The patterned third metal layer and the patterned metal liner are misaligned from the second metal layer so that a portion of the top of the second metal layer is exposed through the openings in the patterned third metal layer and the patterned metal liner. The second metal layer is recessed through the openings in the patterned third metal layer and patterned metal liner to lower the top of the second metal layer and expose sides of the second metal layer aligned with sides of the patterned third metal layer and a top surface of the second metal layer spaced a distance from a bottom surface of the metal liner. The surface of the second metal layer is spaced a distance in the range of about 5 Å to about 100 Å from the bottom surface of the metal liner.

Further embodiments of the disclosure are directed to electronic devices. The electronic devices comprise a second metal layer that is in contact with a first metal layer through a first etch stop layer. The second metal layer has a top portion with exposed sides and a recessed top surface. The exposed sides having a length. A dielectric layer is around portions of the second metal layer. The dielectric layer has a top surface that is substantially even with the recessed top surface of the second metal layer. A patterned metal liner is on the second metal layer and the dielectric layer. The patterned metal liner has openings exposing the top surface of the dielectric and recessed top surface of the second metal layer. The patterned metal liner is spaced a distance from the recessed top surface of the second metal layer and the top surface of the dielectric layer forming a gap. The gap is substantially equal to the length of the exposed sides of the second metal layer. The gap has a length in the range of about 5 Å to about 100 Å. A patterned third metal layer is on the patterned metal liner. The patterned third metal layer has openings exposing the stop surface of the dielectric and recessed top surface of the second metal layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

FIG. 9 illustrates an isometric view of an electronic device according to one or more embodiment of the disclosure;

FIG. 10 illustrates an isometric view of an electronic device according to one or more embodiment of the disclosure;

FIG. 19 illustrates an isometric view of an electronic device according to one or more embodiment of the disclosure; and FIG. 20 illustrates an isometric view of an electronic device according to one or more embodiment of the disclosure.

DETAILED DESCRIPTION

Figure 2:
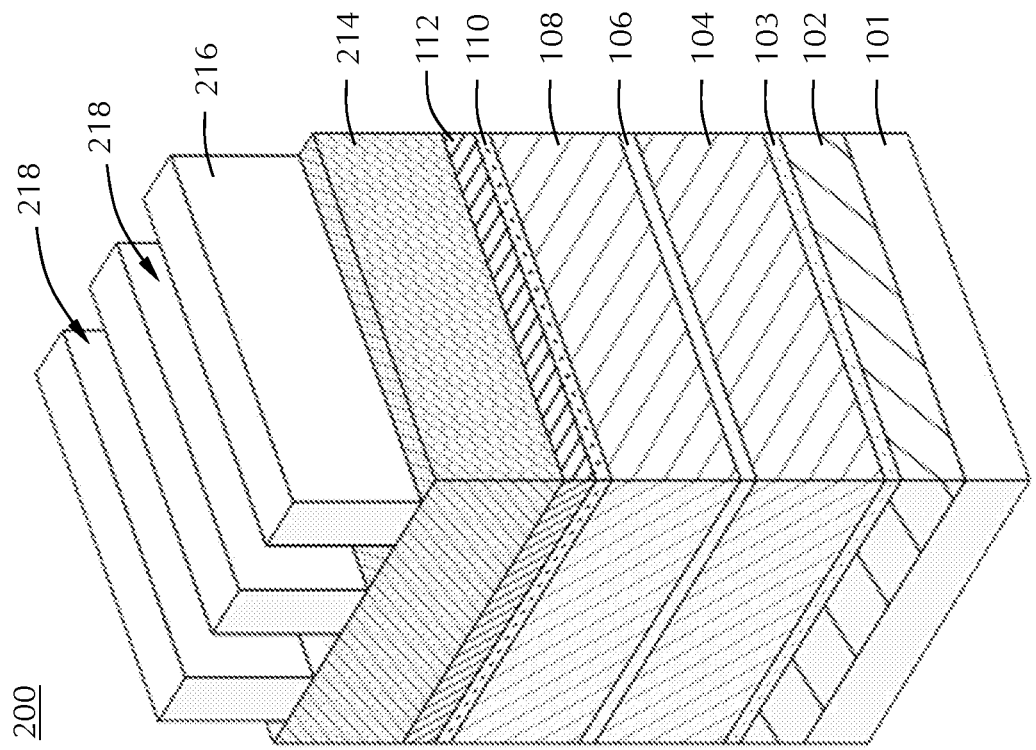
FIG. 2 illustrates an isometric view of an electronic device according to one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the terms "precursor", "reactant", "reactive gas" and the like are used interchangeably to refer to any gaseous species that can react with the substrate surface.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

One or more embodiments of the disclosure advantageously provide methods that enable vias to be fully alignment (relative to both the bottom line and top line) based on a subtractive scheme. Embodiments of the fully-aligned subtractive scheme that allows for formation of an electronic device with or without a metal barrier/liner. Some embodiments advantageously provide full alignment of the via in both orthogonal wire directions.

The present method provides self-aligned interconnect structures for use in combination with semiconductor devices without the use of vias which are filled with contact material. Instead, all contact materials are deposited in conformal layers, so that no filling of any micro conduits with conductive material is required. Subsequently, a pattern is dry etched through a stack of layers which includes the layers of contact materials, so that pillars of contact material extend upward to provide interconnects extending from an underlying base layer which contains contacts which mate with surfaces on a semiconductor device. The pillars of contact material are typically metal, but may be doped ceramic compositions or conductive polymeric materials capable of transferring electrical current. It is also understood that the interconnect structures which are produced need not be in the form of vertical pillars, but may be in other shapes which may be processed from a stack of conformal layers using subtractive techniques.

The description below refers to the creation of metal pillars, because this is likely to be a frequently used form of the self-aligned interconnect structures; however, there is no intent to limit the embodiments to one form of a conductive path which comprises metals, doped ceramic compositions, or may be doped or un-doped conductive polymeric materials to provide the interconnect paths. It is intended that when a "metal" is referred to in the descriptions of the structures below, it is understood that other conductive materials which may be applied in the form of a conformal layer are also intended to be included.

Chemical vapor deposition (CVD), physical vapor deposition (PVD), atomic layer deposition (ALD), and/or electroplated copper has been used as the interconnect material of choice in recent years. However, when the feature size is at the 10 nm Node (16 nm HPCD), due to the eMFP (electron mean free path) of copper (which is about 39 nm), the effective resistivity is in the range of about 6 µΩ-cm. When the feature size is at the 7 nm Node (11 nm HPCD), due to the eMFP of copper, the effective resistivity is in the range of about 6.5 µΩ-cm; and, when the feature size is at the 5 nm Node (7 nm HPCD), the effective resistivity of copper is in the range of about 11.5 µΩ-cm. At the 7 nm Node, and particularly at the 5 nm Node, a metal such as cobalt (with an eMFP of about 9.5 nm compared with 39 for copper), or tungsten (with am eMFP of about 19 nm), and silicide, by way of example, and not by way of limitation, become competitive with copper in terms of effective resistivity. For example, both copper and cobalt have an effective resistivity of about 12 µΩ-cm at the 5 nm Node, and tungsten has an effective resistivity of about 13.5 µΩ-cm. The effective resistivity is the resistivity of the metal at nanometer dimensions. Due to exacerbated electron scattering in nanometer dimensions, the effective resistance of a metal is higher than the intrinsic resistance (the "bulk resistivity" or "resistivity in large dimensions").

Embodiments of the disclosure create an interconnect structure which includes the deposition of multiple layers of materials, followed by the use of subtractive techniques such as the dry etch techniques or Atomic Layer Etch (ALE). The conductive interconnects formed are surrounded by dielectric materials as necessary.

By using a stack of varying layers which include line metal; etch stop material layers having a relatively high conductivity component (in the form of metal or doped ceramic or polymeric material); and, pattern transfer layers which make up a lithography stack (typically including a hard masking material); and by applying subtractive techniques to form desired structures within the stack, it is possible to form interconnect conduits in the form of pillars, for example, without the need to fill a tiny capillary with a fluid conductive material. The method of forming an interconnect structure which is described above makes it possible to progress to devices at the 16 nm Node and below.

Figure 1:
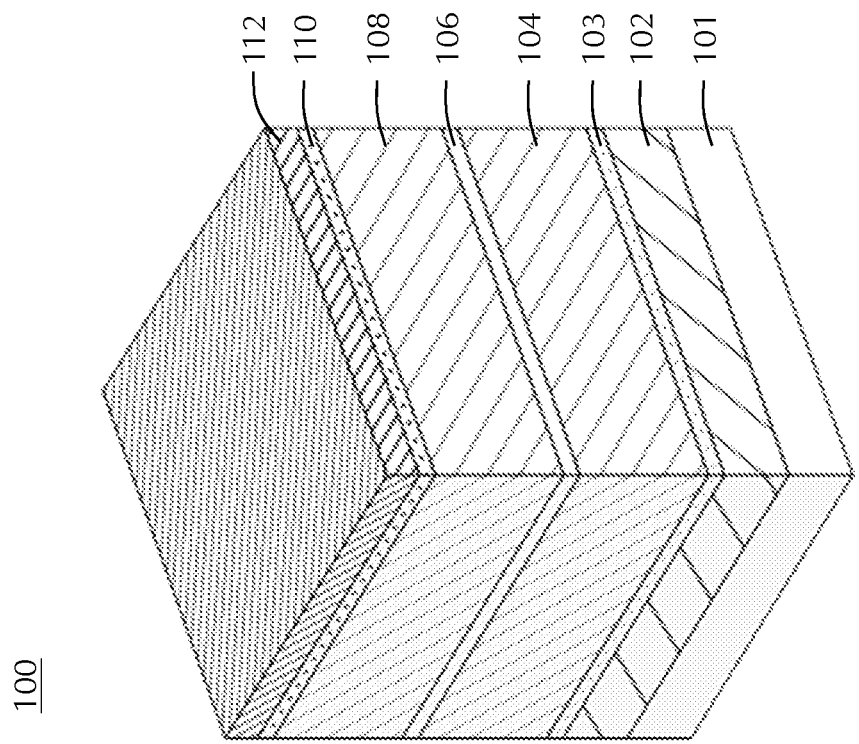
FIG. 1 illustrates an isometric view of an electronic device according to one or more embodiment of the disclosure.

FIG. 1 shows a three dimensional view of an exemplary starting "stack" of layers to be used to form an interconnect structure of the kind useful for the next generation of semiconductor devices. The skilled artisan will recognize that the exemplified stack 100 is merely one possible configuration and should not be taken as limiting the scope of the disclosure. In the illustrated embodiment, a substrate 101 has an oxide layer 102 formed thereon. The substrate can be any suitable material as described herein. For descriptive purposes only, the substrate 101 will be discussed as a silicon substrate. The oxide layer 102 can be grown from the substrate surface or can be deposited on the substrate surface. For example, a silicon substrate could be oxidized to form the oxide layer 102 or a silicon oxide film can be deposited (e.g., by a vapor deposition process) on the substrate 101.

The illustrated embodiment includes an optional metal liner 103. This liner can also be omitted from the stack 100. For example, if the first metal layer 104 has good adhesion to the oxide layer 102, then the optional metal liner 103 may be superfluous and omitted. The optional metal liner 103 can be any suitable material that can increase adhesion of the first metal layer 104 to the oxide layer 102. The optional metal liner 103 can be deposited by any suitable technique known to the skilled artisan including, but not limited to, atomic layer deposition (ALD), chemical vapor deposition (CVD), physical vapor deposition (PVD), evaporation or plating.

The first metal layer 104 (also referred to as a first conductive layer) is on the optional metal liner 103; or on the oxide layer 102 if the optional metal liner 103 is omitted. The first metal layer 104 can be any suitable layer deposited by any suitable technique known to the skilled artisan. In some embodiments, the first metal layer 104 is a conformal layer. Suitable materials for the first metal layer 104 include, but are not limited to, tungsten (W), cobalt (Co), ruthenium (Ru), molybdenum (Mo), aluminum (Al), copper (Cu), silicide, graphene, or combinations thereof. In some embodiments, the first metal layer 104 comprises one or more of tungsten (W), cobalt (Co), ruthenium (Ru), molybdenum (Mo), aluminum (Al), copper (Cu), silicide or graphene. In some embodiments, the first metal layer 104 consists essentially of one or more of tungsten (W), cobalt (Co), ruthenium (Ru), molybdenum (Mo), aluminum (Al), copper (Cu), silicide or graphene. As used in this specification and the appended claims, the term "consists essentially of" means that the subject film, species, etc., is greater than or equal to about 95%, 98%, 99% or 99.5% of the stated materials. If more than one component is stated for a material (e.g., the film consists essentially of tungsten and cobalt), the sum of the stated components is greater than or equal to about 95%, 98%, 99% or 99.5%. In some embodiments, the first metal layer 104 comprises a pure metal doped with small amounts of other metals. For example, copper, tungsten, ruthenium or molybdenum doped with up to 5% dopant (e.g., aluminum, manganese, etc.). The first metal layer 104 consisting essentially of a doped metal means that the first metal layer 104 comprises up to 5 atomic % of a dopant. In some embodiments, the dopant comprises one or more of aluminum, manganese, phosphorous, astitine or boron.

A first etch stop layer 106, which has low electrical resistivity overlies the first metal layer 104. The first etch stop layer 106 can be any suitable material, including, but not limited to a conformal layer of tantalum (Ta), tantalum nitride (TaN), titanium (Ti), titanium nitride (TiN), W, Co, Ru, niobium (Nb), niobium nitride (NbN), and combinations thereof, which are deposited using a technique selected from CVD, PVD, ALD, deposition from an evaporated source of metal, metal plating, or may be an oxide of Ti, which is doped with a dopant such as a silicide. In some embodiments, the first etch stop layer 106 comprises or consists essentially of one or more of titanium silicon nitride (TiSiN), tantalum silicon nitride (TaSiN) or tungsten silicon nitride (WSiN).

A second metal layer 108 is formed on the first etch stop layer 106. The second metal layer 108 may (but need not be) the same as the first metal layer 104 described above. In some embodiments, the second metal layer 108 comprises the same composition as the first metal layer 104. In some embodiments, the second metal layer 108 comprises a different composition than the first metal layer 104. As used herein, different compositions include, but are not limited to, compositions having the same materials with different physical properties or compositions of the same materials formed by different techniques. In some embodiments, the first metal layer 104 and second metal layer 108 comprises one or more of ruthenium, molybden or tungsten. In some embodiments, the first metal layer 104 comprises or consists essentially of one or more of ruthenium, molybdenum or tungsten. In some embodiments, the second metal layer 108 comprises or consists essentially of one or more of ruthenium, molybdenum or tungsten. In some embodiments, the first metal layer 104 and the second metal layer 108 comprise or consist essentially of the same metal.

A second etch stop layer 110 overlies the second metal layer 108. The second etch stop layer 110 composition may be (but need not be) the same as the first etch stop layer 106. Having the first etch stop layer 106 and second etch stop layer 110 as the same material may simplify processing. In some embodiments, the second etch stop layer 110 comprises the same composition as the first etch stop layer 106. In some embodiments, the second etch stop layer 110 comprises a different composition than the first etch stop layer 106. In some embodiments, the first etch stop layer 106 and second etch stop layer 110 comprise or consist essentially of the same material. In some embodiments, the first etch stop layer 106 and the second etch stop layer 110 comprise different materials. Suitable etch stop layer materials include, but are not limited to titanium nitride (TiN), tantalum (Ta), or tantalum nitride (TaN). In some embodiments, the second etch stop layer 110 is omitted and the subsequent hard mask layer 112 functions as both the etch stop layer 110 and the hard mask layer 112.

A hard mask layer 112 overlies the second etch stop layer 110. The hard mask layer is used in combination with an overlying "lithography stack" to transfer a device pattern through underlying layers 110, 108, 106, and 104 which are described above. The hard mask layer 112 may be a single layer or a combination of layers. The hard mask layer 112 is not described herein, but may be fabricated using materials and patterning techniques which are known in the art as being capable of providing a pattern at a 10 nm Node (16 nm HPCD) or lower. In some embodiments, the hard mask layer 112 comprises a metallic or dielectric mask material. Suitable dielectric materials include, but are not limited to, silicon oxide (SiO), silicon nitride (SiN), silicon carbide (SiC), aluminum oxide ($AlO_x$), aluminum nitride (AlN) and combinations thereof. The skilled artisan will recognize that the use of formulas like SiO, to represent silicon oxide, does not imply any particular stoichiometric relationship between the elements. The formula merely identifies the primary elements of the film.

FIG. 2 illustrates an electronic device 200 similar to the embodiment of FIG. 1 with a bottom anti-reflective coating (BARC) 214 and photoresist 216 formed thereon. The photoresist 216 shown is patterned with trenches 218; however, the skilled artisan will recognize that the pattern can be any suitable shape or combination of shapes.

Figure 3:
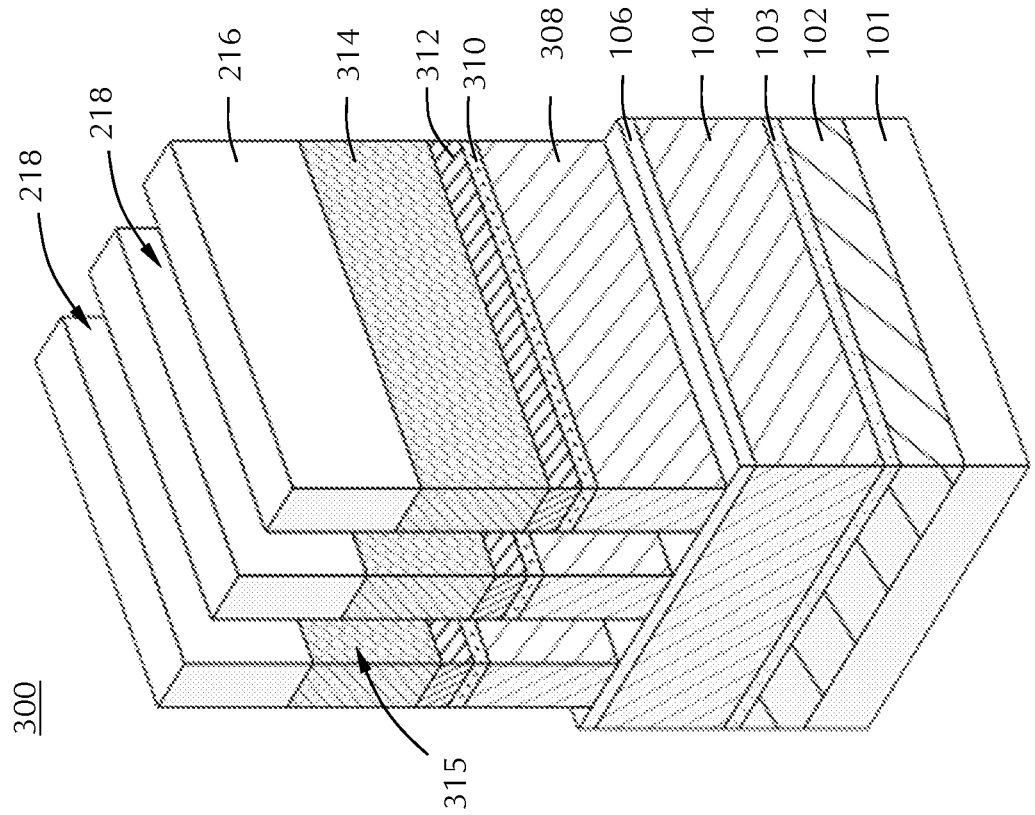
FIG. 3 illustrates an isometric view of an electronic device according to one or more embodiment of the disclosure.

FIG. 3 illustrates an electronic device 300 similar to FIG. 2 after an M1 line etch process. The M1 line etch process creates openings that correspond to the trenches 218 in the photoresist 216. In the illustrated embodiment, a trench 315 is formed through the BARC 214, hard mask layer 112, second etch stop layer 110 and second metal layer 108 to form, respectively, a patterned BARC 314, patterned hard mask layer 312, patterned second etch stop layer 310 and patterned second metal layer 308. The M1 line etch process illustrated stops at the first etch stop layer 106. In some embodiments, the first etch stop layer 106 is also patterned. Forming the patterned layers can be performed in a single process or multiple processes.

Figure 4:
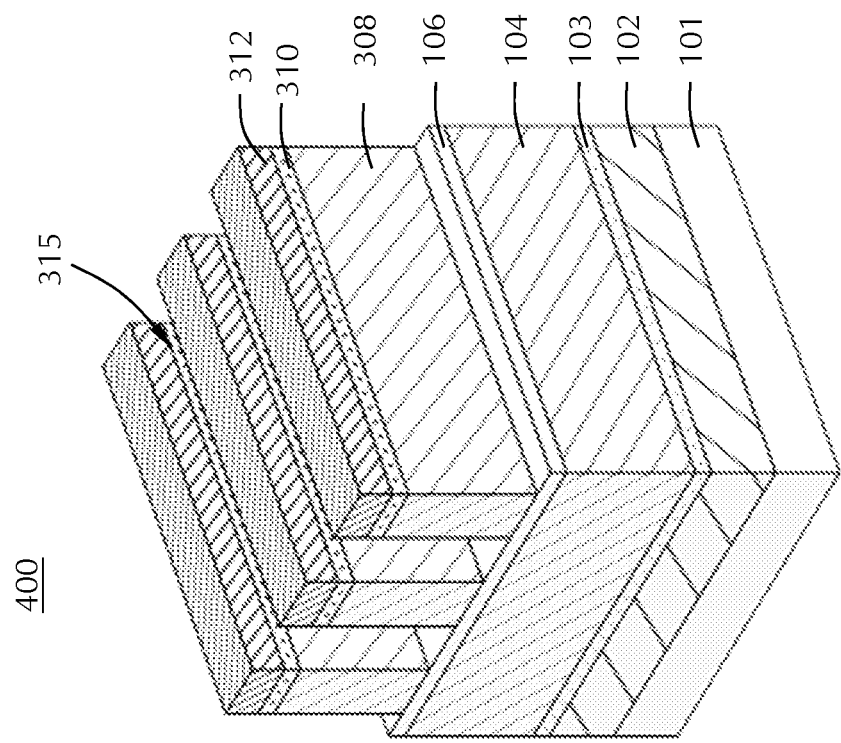
FIG. 4 illustrates an isometric view of an electronic device according to one or more embodiment of the disclosure.

FIG. 4 illustrates an electronic device 400 similar to FIG. 3 after the removal of the photoresist 216 and patterned BARC 314, leaving the patterned hard mask layer 312. Removal of the photoresist 216 and patterned BARC 314 can be done by any suitable technique known to the skilled artisan including, but not limited to, anisotropic etching and chemical-mechanical planarization (CMP).

Figure 5:
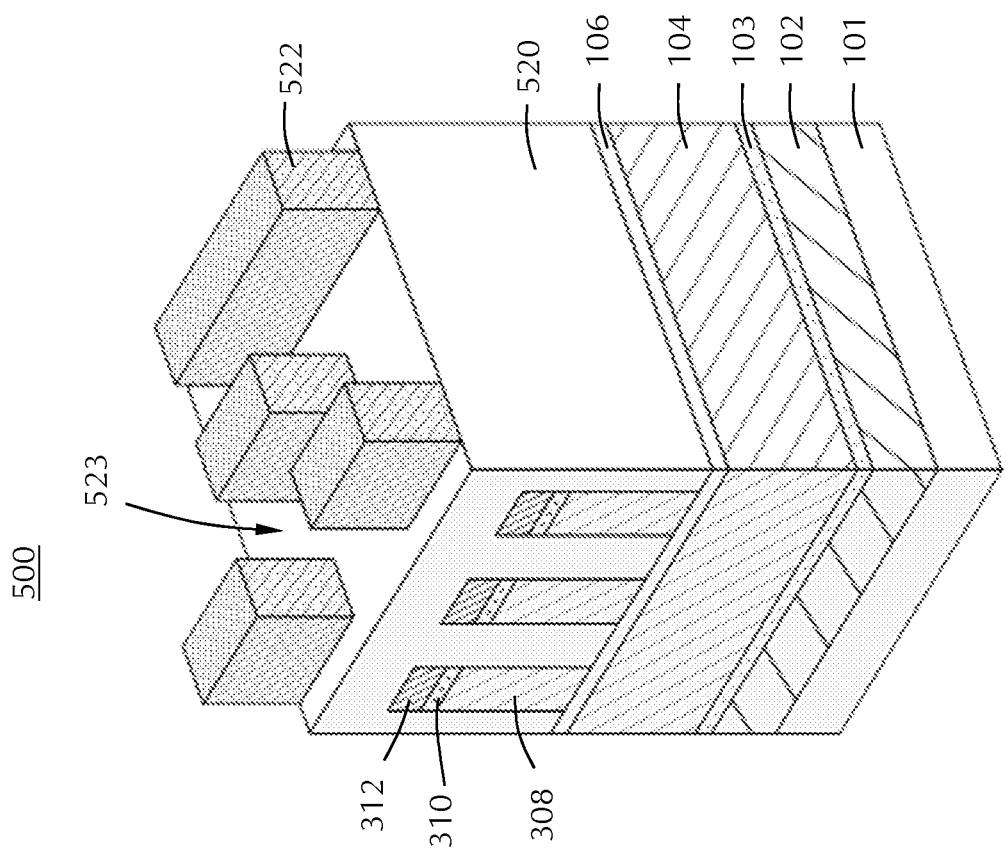
FIG. 5 illustrates an isometric view of an electronic device according to one or more embodiment of the disclosure.

FIG. 5 illustrates an electronic device 500 similar to FIG. 4 after formation of a second bottom anti-reflective coating (BARC) 520 and a second patterned photoresist 522. The second patterned photoresist 522 shown is aligned at an angle relative to the trenches 315. The illustrated embodiment shows the second patterned photoresist 522 with openings 523 aligned at about 90° relative to the trenches 315; however, the skilled artisan will recognize that the angle between the second patterned photoresist 522 and the trenches 315 can be in the range of about 10° to about 90°. Deposition of the second BARC 520 and second patterned photoresist 522 can be done by any suitable techniques known to the skilled artisan.

Figure 6:
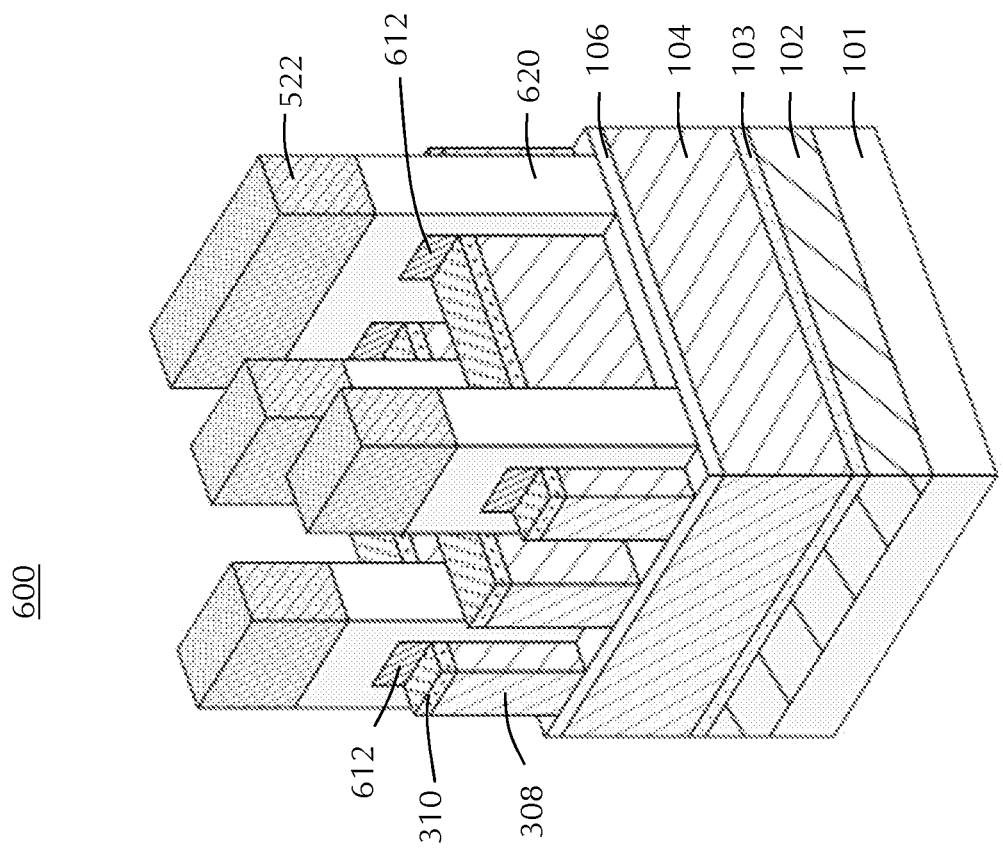
FIG. 6 illustrates an isometric view of an electronic device according to one or more embodiment of the disclosure.

FIG. 6 illustrates an electronic device 600 similar to FIG. 5 after anisotropic etching through the openings 523 in the patterned second photoresist 522. The illustrated etch process has removed portions of the second BARC 520 and patterned hard mask layer 312 not covered by the photoresist material, leaving, respectively, a patterned second BARC 620 and a patterned hard mask layer 612. The illustrated etch process is stops at patterned second etch stop layer 310 and first etch stop layer 106. Portions of the device located beneath (relative to the etch direction) the second patterned BARC 522 and patterned second etch stop 310 remain.

Figure 7:
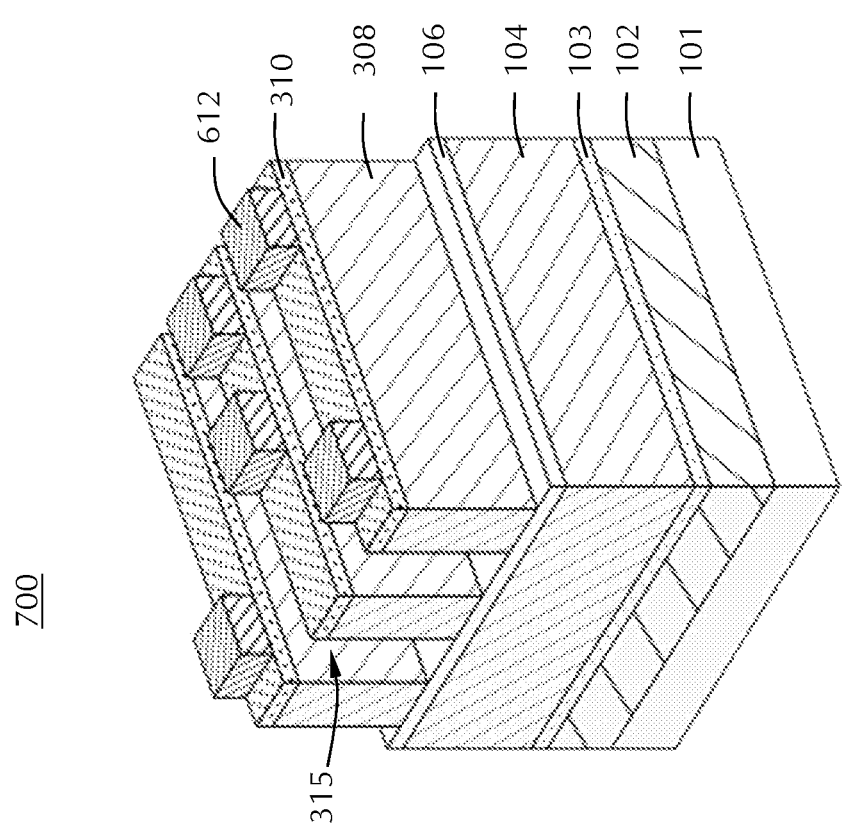
FIG. 7 illustrates an isometric view of an electronic device according to one or more embodiment of the disclosure.

FIG. 7 illustrates an electronic device 700 similar to FIG. 6 after removal of the patterned second photoresist 522 and patterned second BARC 620. The patterned second photoresist 522 and patterned second BARC 620 can be removed separately or in the same process.

Figure 8:
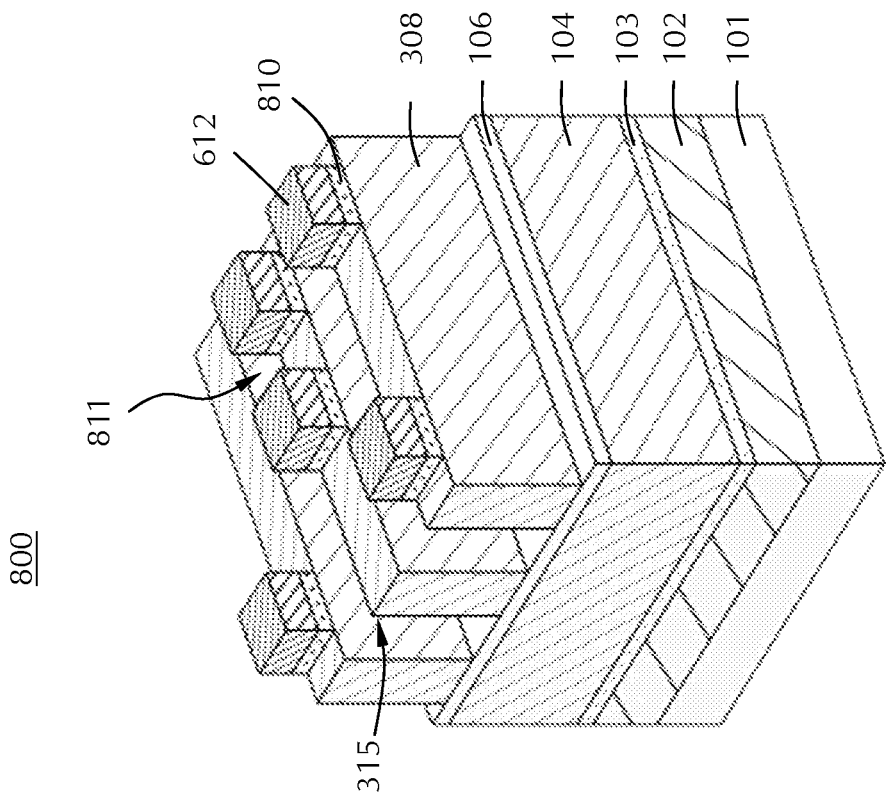
FIG. 8 illustrates an isometric view of an electronic device according to one or more embodiment of the disclosure.

FIG. 8 illustrates an electronic device 800 similar to FIG. 7 after an etch process to remove the portions of second etch stop layer 310 that are not covered by the patterned hard mask layer 612. This process leaves the top 309 of the patterned second metal layer 308 exposed in spaces 811 between patterned hard mask layer 612 and patterned second etch stop layer 810.

FIG. 9 illustrates an electronic device 900 similar to FIG. 8 after etching to remove portions of the second metal layer 308 and the first etch stop layer 106 to form columns of the second metal (vias 908) on pads of first etch stop layer 906. The etch also transfers the pattern through trenches 315 to the first metal layer 104 to form a patterned first metal layer 904.

FIG. 10 illustrates an electronic device 1000 similar to FIG. 9 after etching exposed portions of the optional metal liner 103 to leave a patterned optional metal liner 1003. In embodiments in which there is no optional metal liner 103, this etch process can be skipped.

Figure 11:
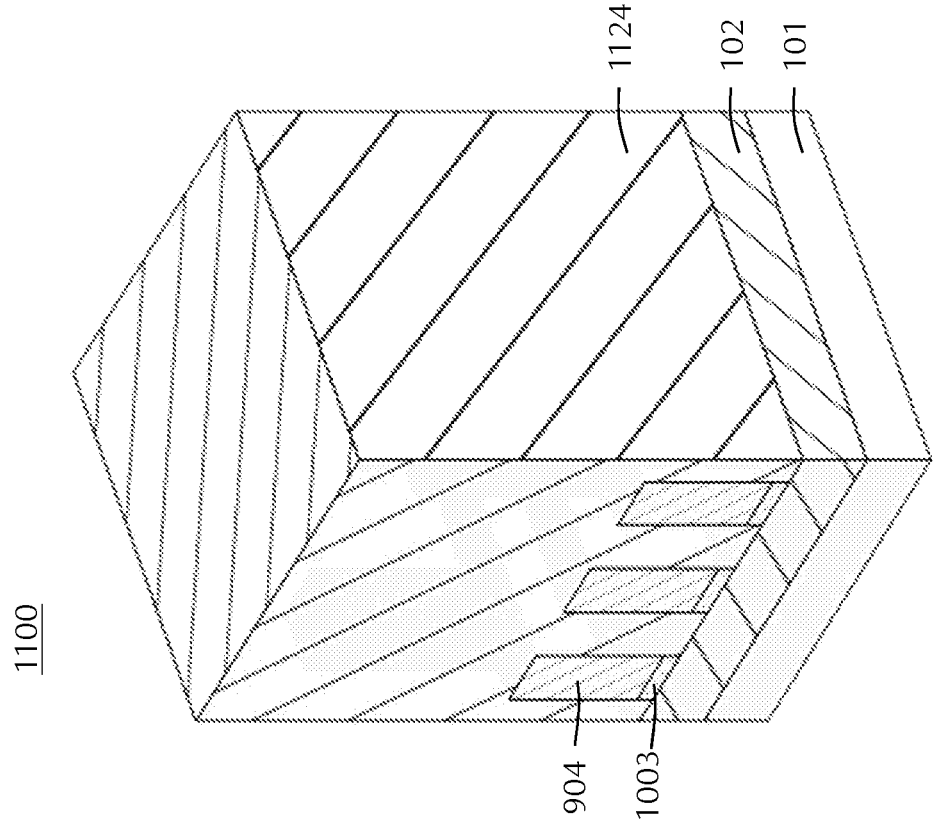
FIG. 11 illustrates an isometric view of an electronic device according to one or more embodiment of the disclosure.

FIG. 11 illustrates an electronic device 1100 similar to FIG. 10 after deposition of a dielectric layer 1124. The dielectric layer 1124 can be deposited by any suitable technique known to the skilled artisan. In some embodiments, the dielectric layer 1124 comprises a low-k dielectric. In some embodiments, the low-k dielectric is deposited by a flowable CVD process.

Figure 12:
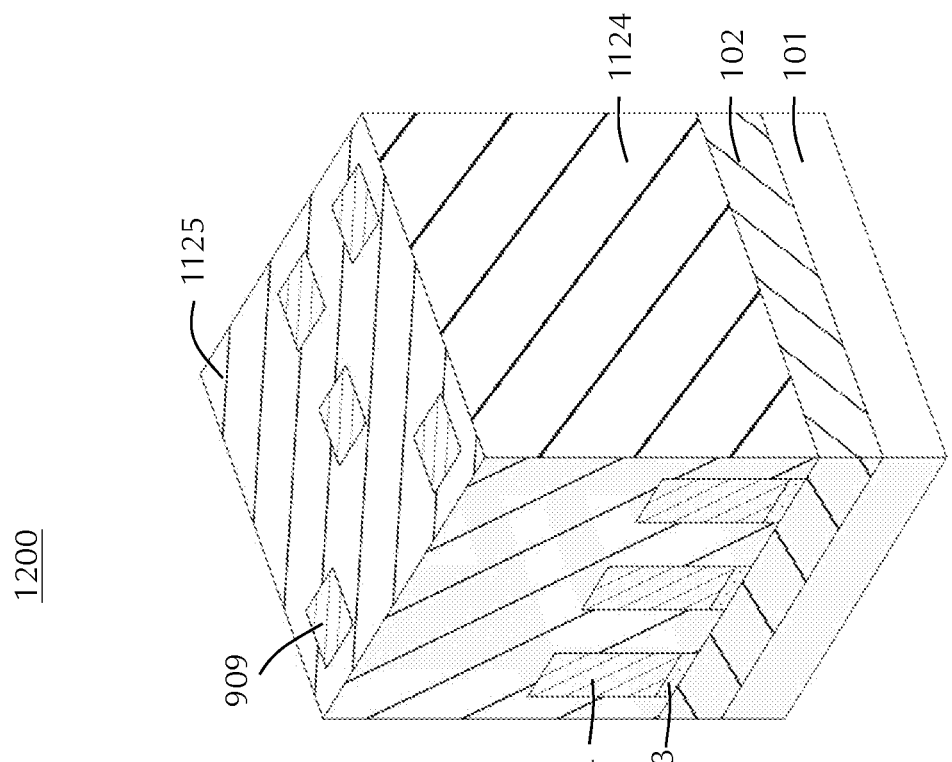
FIG. 12 illustrates an isometric view of an electronic device according to one or more embodiment of the disclosure.

FIG. 12 illustrates an electronic device 1200 similar to FIG. 11 after chemical-mechanical planarization (CMP) of the dielectric layer 1124. The CMP process removes material from the dielectric layer 1124 to lower the top 1125 of the dielectric layer 1124, the patterned hard mask layer 612 and the patterned second etch stop layer 810 to expose the patterned second metal layer (via 908). The patterned second metal layer (via 908) is also referred to as a first via (V1 or Vx). The first metal layer is also referred to as M1 or Mx. The first via will connect the patterned first metal layer 904 to a layer above the first via that has yet to be formed with the combination also referred to as M1-V1 or Mx-Vx.

Figure 13:
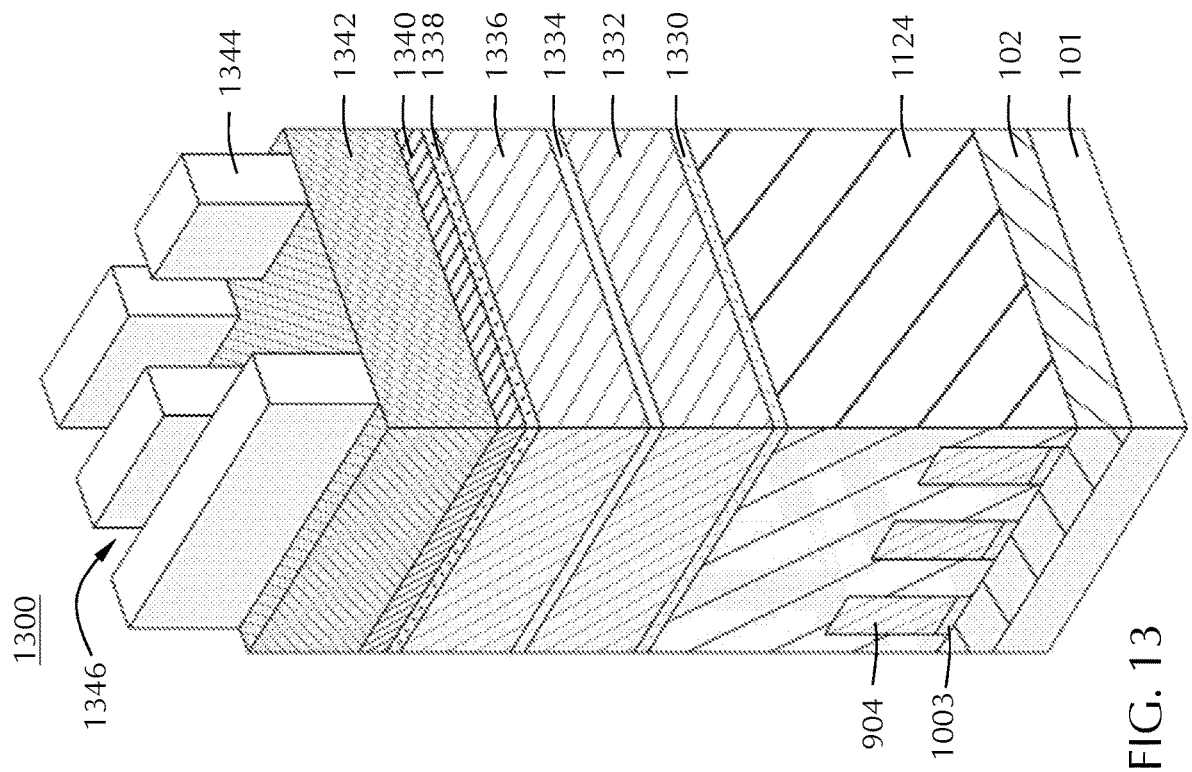
FIG. 13 illustrates an isometric view of an electronic device according to one or more embodiment of the disclosure.

FIG. 13 illustrates an electronic device 1300 similar to FIG. 12 after formation of a layer stack thereon. The layer stack is similar to that of FIG. 1 rotated at an angle. The layer stack comprises an optional second metal liner 1330 which can be omitted as described above. A third metal layer 1332, a third etch stop layer 1334, a fourth metal layer 1336, a fourth etch stop layer 1338, a second hard mask layer 1340, a second BARC 1342 and a third patterned photoresist 1344. For illustrative purposes, the pattern of trenches 1346 of the third patterned photoresist 1344 is different than the pattern of the first vias. The illustrated patterns should not be taken as limiting the scope of the disclosure.

Figure 14:
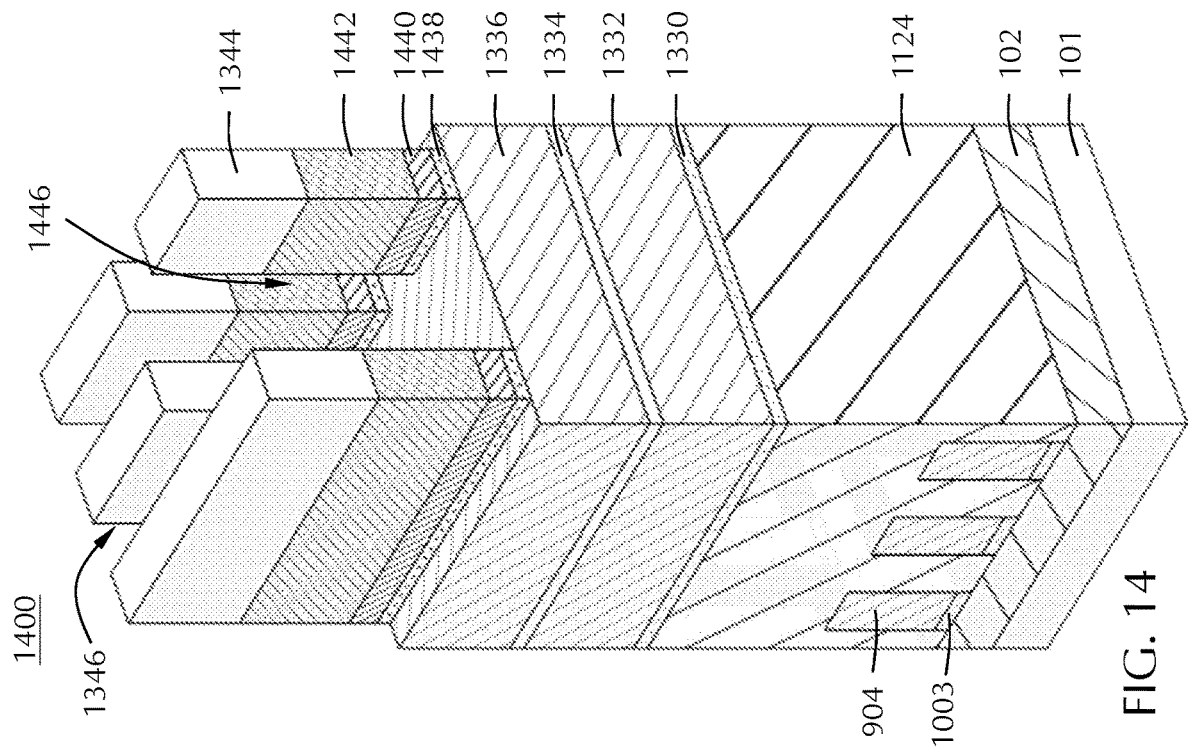
FIG. 14 illustrates an isometric view of an electronic device according to one or more embodiment of the disclosure.

FIG. 14 illustrates an electronic device 1400 similar to FIG. 13 after a similar process to that illustrated in FIG. 3 has been performed. Briefly, the second BARC 1342, second hard mask layer 1340 and fourth etch stop layer 1338 are etched through trenches 1346 in the third patterned photoresist 1344 to transfer the pattern to the fourth etch stop layer 1338 to form, respectively, a patterned second BARC 1442, a patterned second hard mask layer 1440 and a patterned fourth etch stop layer 1438.

Figure 15:
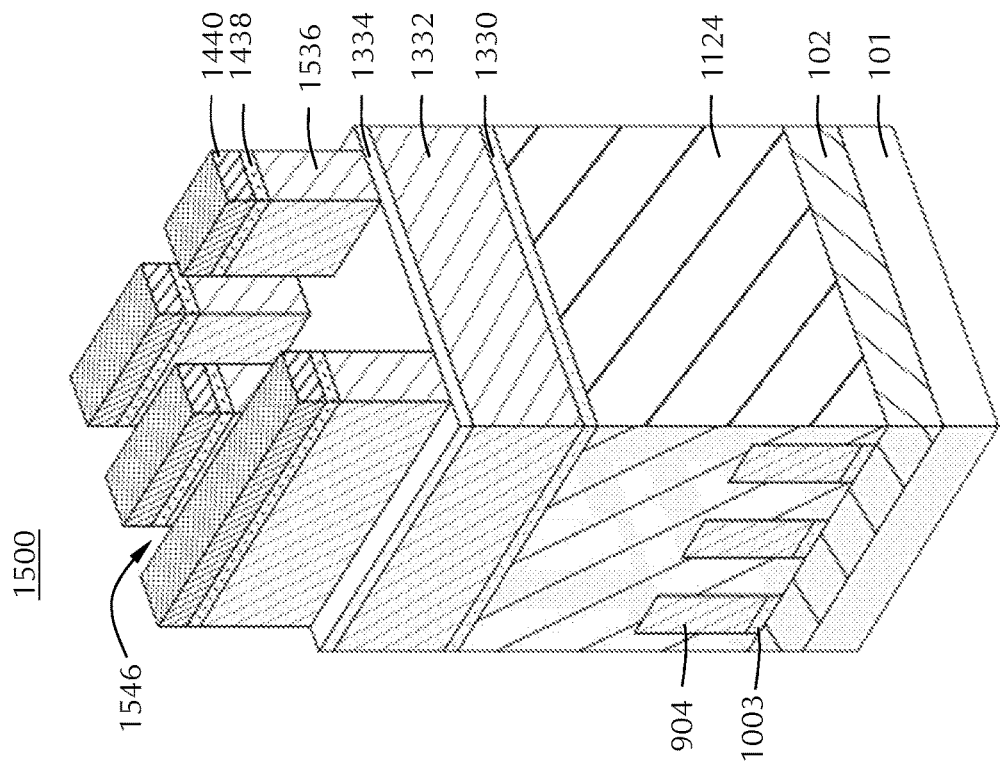
FIG. 15 illustrates an isometric view of an electronic device according to one or more embodiment of the disclosure.

FIG. 15 illustrates an electronic device 1500 similar to FIG. 14 after a similar process to that illustrated in FIG. 4 has been performed. Briefly, the third patterned photoresist 1344 and pattered second BARC 1442 have been etched and the pattern 1346, 1446 is etched into the fourth metal layer 1336 to generate a patterned fourth metal layer 1536 with a pattern 1546.

Figure 16:
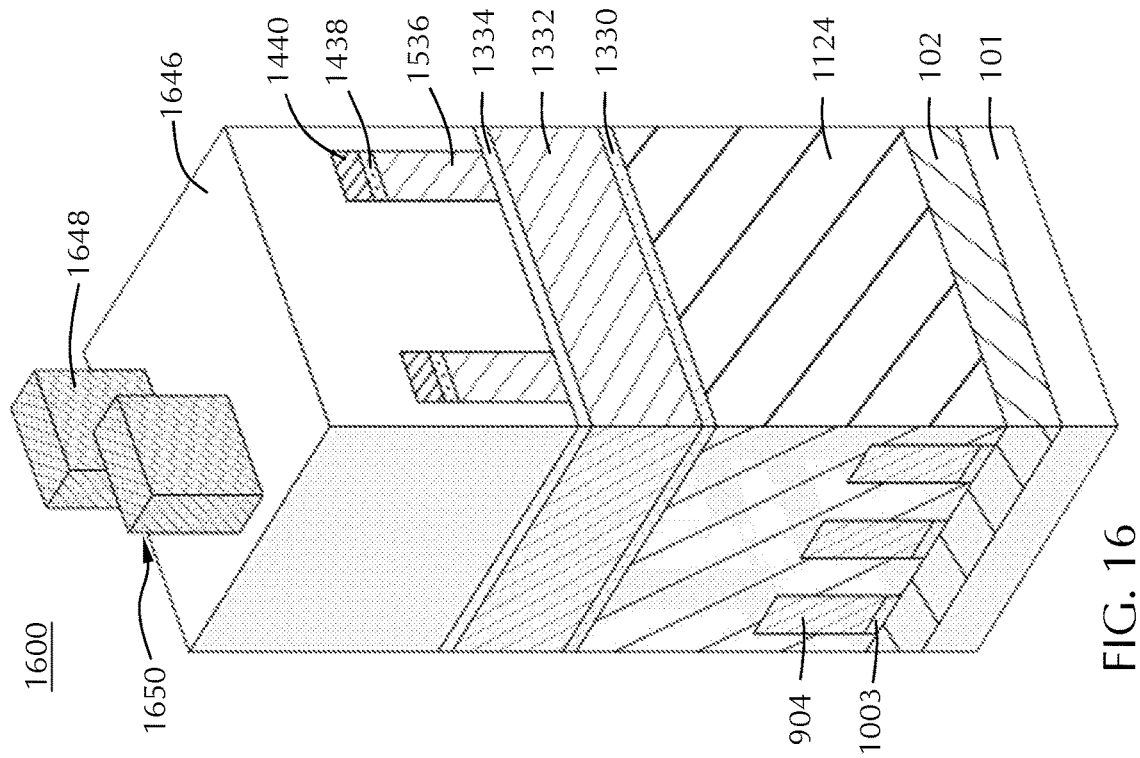
FIG. 16 illustrates an isometric view of an electronic device according to one or more embodiment of the disclosure.

FIG. 16 illustrates an electronic device 1600 similar to FIG. 15 after deposition of a fourth BARC 1646 and fourth patterned photoresist 1648, similar to FIG. 5. The fourth BARC 1646 can be the same as the dielectric layer 1124 or different therefrom. The fourth patterned photoresist 1648 is deposited and pattern 1650 formed by any suitable technique (e.g., lithography) known to the skilled artisan.

Figure 17:
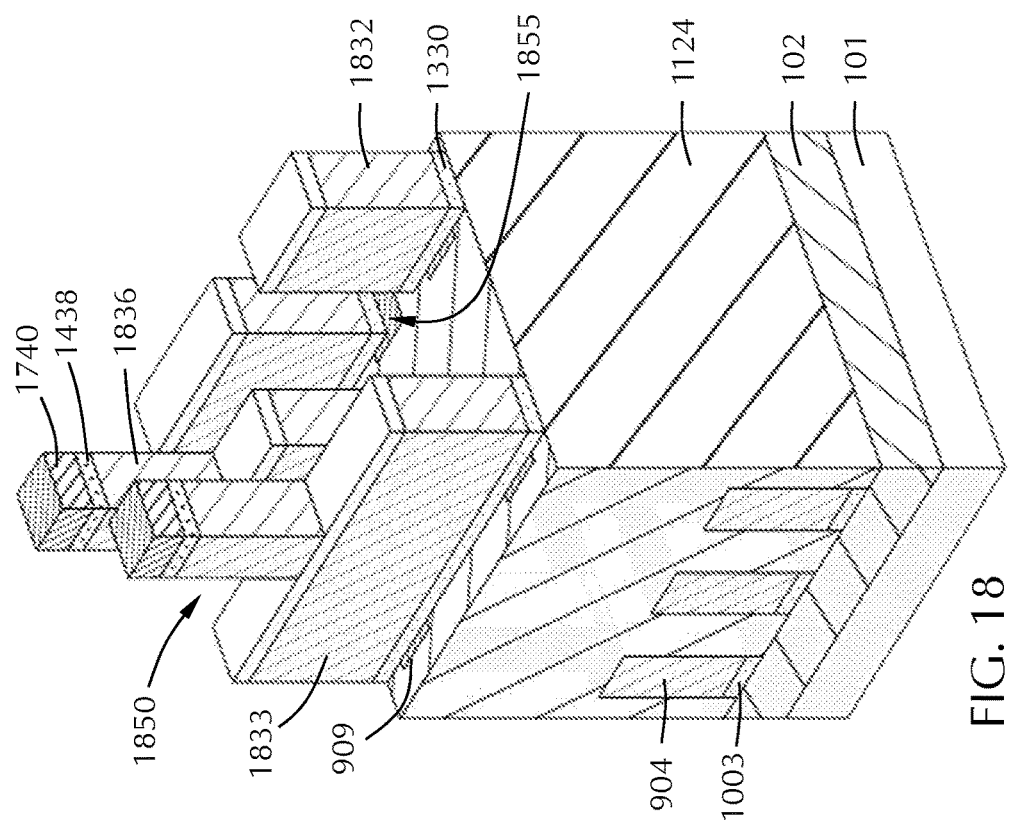
FIG. 17 illustrates an isometric view of an electronic device according to one or more embodiment of the disclosure.

FIG. 17 illustrates an electronic device 1700 similar to FIG. 16 after transferring the pattern 1650 into the patterned second hard mask layer 1440 to form patterned hardmask layer 1740 with pattern 1750 similar to pattern 1650. The fourth photoresist 1648 and fourth BARC 1646 are also removed.

Figure 18:
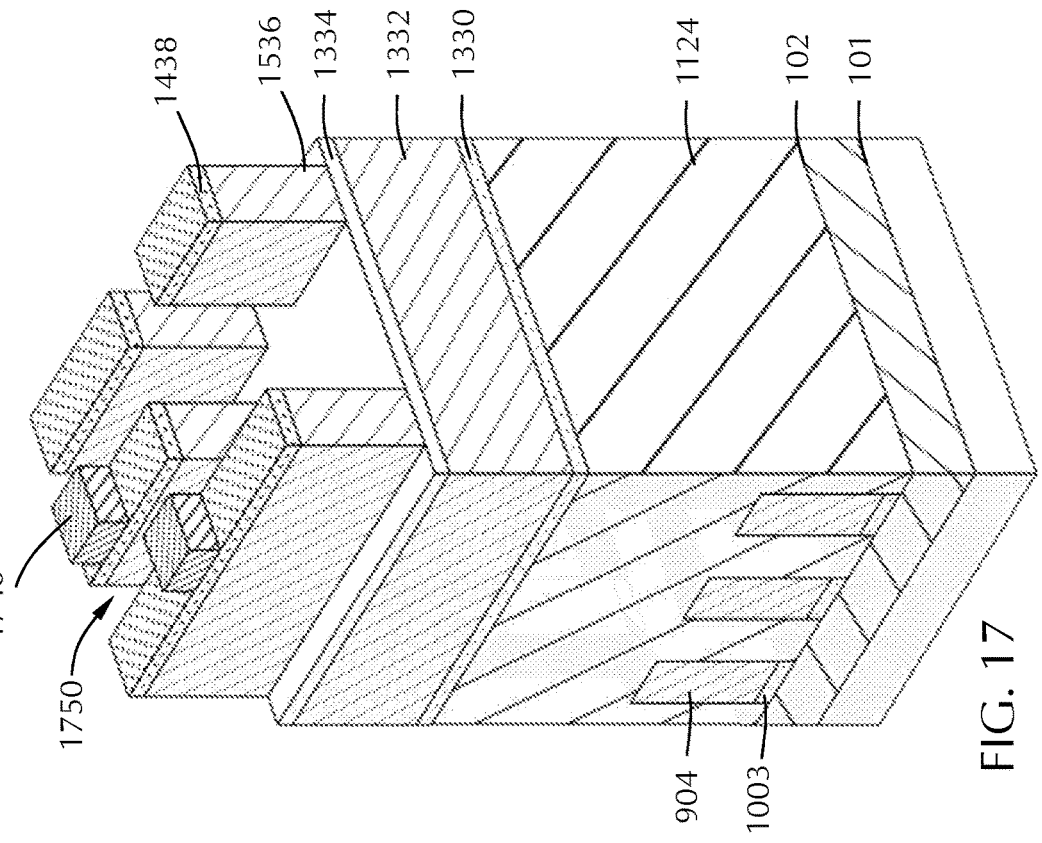
FIG. 18 illustrates an isometric view of an electronic device according to one or more embodiment of the disclosure.

FIG. 18 illustrates an electronic device 1800 similar to FIG. 17 after transferring the pattern 1750 into the third metal layer 1332 to form patterned third metal layer 1332. The patterned fourth metal layer 1436 and patterned fourth etch stop 1438 are modified to become, respectively, patterned fourth metal layer 1836 and patterned fourth etch stop 1838. The third metal layer 1332 acts as a second metal line (M2 or Mx+1) in electrical contact with the first metal line (M1 or Mx) through via 908. In some embodiments, the dielectric layer 1124 and second dielectric 2024 prevent electrical leakage/shorts at the wire locations designed to be insulated.

The embodiment illustrated shows a misalignment 1855 of the patterned third metal layer 1832 relative to the vias 908. The misalignment 1855 of these features can result in electrical shorting between adjacent vias. FIG. 19 illustrates an electronic device 1900 similar to FIG. 18 after recessing the top 1125 of the dielectric layer 1124 and a top 909 of the second metal layer (via 908). The recessed dielectric layer 1124 exposes a length Lv of the second metal layer (via 908). The length Lv of the second metal layer (via 908) that is exposed is directly proportional to the amount that the dielectric layer 1124 is recessed and the amount that the top 909 of the second metal layer 908 is recessed. In some embodiments, the length of the second metal layer (via 908) exposed is in the range of about 5 Å to about 10 Å, or in the range of about 10 Å to about 90 Å, or in the range of about 15 Å to about 80 Å, or in the range of about 20 Å to about 70 Å, or in the range of about 25 Å to about 60 Å. In some embodiments, the length Lv of the exposed second metal layer, which is the same as the distance between the top of the second metal layer to the bottom of the optional metal liner or third metal layer, is greater than or equal to about 2 Å, 5 Å, 10 Å, 15 Å, 20 Å or 25 Å. The third etch stop 1334 acts as a mask for the recess process to maintain alignment of the via 908.

Recessing the dielectric layer lowers the top 909 of the second metal layer (via 908) to expose sides 911 of the second metal layer (via 908). The sides 911 of the second metal layer are aligned with sides 1833 of the patterned third metal layer 1832 because the third etch stop 1334 acts as a mask. The recessing process lowers the top 909 of the second metal layer (via 908) and creates or increases the distance from a bottom 1831 of the third metal layer 1830 to the top 909.

In the illustrated embodiment, optional second metal liner 1330 is present which will space the bottom 1831 of the third metal layer 1830 from the top 909 of the second metal layer (via 908). In this case, recessing the top 909 increases the distance between the top 909 and the bottom 1831 of the third metal line and creates a distance between the top 909 and the bottom 1331 of the optional second metal liner 1330.

FIG. 20 illustrates an electronic device 2000 similar to FIG. 19 after depositing a second dielectric 2024 and planarizing the top 2025 to expose the fourth metal layer 1836 as a second via. In some embodiments, the second via (V2) can connect the second metal line (third metal layer 1832) with a subsequent metal line deposited by a similar or different method.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of forming fully aligned vias, the method comprising:
   patterning a third metal layer on a top of a second metal layer in electrical contact with a first metal layer, the patterned third metal layer misaligned from the second metal layer so that a portion of the top of the second metal layer is exposed, a patterned fourth metal layer and a patterned fourth etch stop layer acting as a mask for patterning the third metal layer, wherein the patterned fourth metal layer and the patterned fourth etch stop layer being formed comprising depositing a fourth metal layer and a fourth etch stop layer on the third metal layer, patterning the fourth metal layer and the fourth etch stop layer using a hard mask layer and a patterned photoresist; and recessing the top of the second metal layer to expose sides of the second metal layer aligned with sides of the patterned third metal layer and a top of the second metal layer a distance from a bottom of the third metal layer.

2. The method of claim 1, wherein a metal liner is positioned between the top of the second metal layer and the bottom of the third metal layer and recessing the top of the second metal layer creates a distance between the top of the second metal layer and the bottom of the metal liner.

3. The method of claim 2, wherein the top surface of the second metal layer is spaced a distance in the range of about 5 Å to about 100 Å from the bottom surface of the metal liner.

4. The method of claim 1, further comprising depositing a dielectric layer on the recessed top of the second metal layer and the third metal layer.

5. The method of claim 4, wherein the dielectric layer comprises a low-k dielectric material.

6. The method of claim 5, wherein the low-k dielectric material is deposited by a flowable chemical vapor deposition process.

7. The method of claim 4, wherein the dielectric layer covers a top of a fourth metal layer on the third metal layer.

8. The method of claim 7, further comprising planarizing the dielectric layer to expose the top of the fourth metal layer.

9. The method of claim 1, wherein contact between the second metal layer and the third metal layer has an effective resistivity of less than or equal to about 20 $\mu\Omega$-cm.

10. The method of claim 1, wherein contact between the second metal layer and the third metal layer has an Electron Mean Free Path less than or equal to about 20 nm.

* * * * *

UNITED STATES PATENT AND TRADEMARK OFFICE
CERTIFICATE OF CORRECTION

PATENT NO.         : 11,410,885 B2
APPLICATION NO.    : 16/864623
DATED              : August 9, 2022
INVENTOR(S)        : He Ren et al.

It is certified that error appears in the above-identified patent and that said Letters Patent is hereby corrected as shown below:

In the Specification

•Column 6, Line 16, after "phosphorous,", replace "astitine" with "astatine".

•Column 6, Line 44, after "ruthenium,", replace "molybden" with "molybdenum".

Signed and Sealed this
Fourth Day of October, 2022

Katherine Kelly Vidal
*Director of the United States Patent and Trademark Office*